US006967067B2

(12) United States Patent
Herr et al.

(10) Patent No.: US 6,967,067 B2
(45) Date of Patent: *Nov. 22, 2005

(54) PATTERNING METHODS AND SYSTEMS USING REFLECTED INTERFERENCE PATTERNS

(75) Inventors: Daniel J. C. Herr, Chapel Hill, NC (US); David Charles Joy, Knoxville, TN (US)

(73) Assignee: University of Tennessee Research Foundation, Knoxville, TN (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/796,640

(22) Filed: Mar. 9, 2004

(65) Prior Publication Data

US 2004/0170928 A1 Sep. 2, 2004

Related U.S. Application Data

(63) Continuation of application No. 09/781,881, filed on Feb. 12, 2001, now Pat. No. 6,730,443.

(60) Provisional application No. 60/185,288, filed on Feb. 28, 2000.

(51) Int. Cl.⁷ .............................. G03H 5/00; G03H 1/04
(52) U.S. Cl. ............................... 430/1; 430/2; 430/322; 351/35; 351/15
(58) Field of Search ..................... 430/1, 2, 311, 322; 359/35, 15

(56) References Cited

U.S. PATENT DOCUMENTS

| 3,582,176 A | 6/1971 | Mathisen |
| 4,325,637 A | 4/1982 | Moore |
| 4,498,771 A | 2/1985 | Makosch et al. |
| 4,614,427 A | 9/1986 | Koizumi et al. |
| 4,788,116 A * | 11/1988 | Hochberg ..................... 430/21 |
| 5,455,850 A | 10/1995 | Howells et al. |
| 5,568,256 A | 10/1996 | Korner et al. |
| 5,923,423 A | 7/1999 | Sawatari et al. |
| 5,973,807 A | 10/1999 | Buchkremer et al. |
| 6,730,443 B2 * | 5/2004 | Herr et al. ..................... 430/1 |

FOREIGN PATENT DOCUMENTS

| GB | 2221353 | 1/1990 |
| JP | 03-295408 | 12/1991 |
| JP | 06-283585 | 10/1994 |
| JP | 09-016062 | 1/1997 |
| JP | 11-329944 | 11/1999 |

OTHER PUBLICATIONS

V. Georges et al; *Images charged objects using low-energy-electron coherent beams,* Ultramicroscopy 90 (2001) pp 32-38.

Palmer et al., "Diffraction gratings," Rep. Prog. Phys., vol.. 38, 1975, pp. 975-1048.

Microchannel Plate (MCP), http://www.hpk.co.jp/eng/products/ETD/mcpe/mcpe.htm, Mar. 28, 2003, 2 pages.

(Continued)

Primary Examiner—Martin Angebranndt
(74) Attorney, Agent, or Firm—Myers Bigel Sibley & Sajovec

(57) ABSTRACT

A method for patterning a layer on a substrate can include projecting coherent radiation toward a reflector surface so that the coherent radiation is reflected off the reflector surface to provide a holographic projection of a desired image wherein the reflector surface includes information that corresponds to an inverse of the holographic projection of the desired image. The substrate including the layer can be maintained in the path of the reflected radiation so that the holographic projection is projected onto the layer. Related systems are also discussed.

63 Claims, 11 Drawing Sheets

OTHER PUBLICATIONS

Microchannel Plate Principles of Operation, http://hea-www.harvard.edu/HRC/mcp/mcp.html, Mar. 28, 2003, 4 pages.

Skala, Melissa, Imaging X-Ray Fluorescence Using Microchannel Plate (MCP) Optics, Physics Department, Washington State University, Pullman, WA 99163, no date, 10 pages.

A Well Collimated Quasi-Continuous Atom Laser, http://physics.nist.gov/Divisions/Div842/Gp4/AtomOptics/intro.html, May 26, 2003, 2 pages.

Module 1-4 Properties of Light, http://www.dewtronics.com/tutorials/lasers/leot/course01_mod04/mod01-04.htm, May 26, 2003, 32 pages.

E. Hecht: "Optics" 1987, Addison-Wesley XP002184727, p. 593-596.

Anonymous: "Wafer Conformable Mask Image", Research Disclosure (Dec. 1984) p. 609 XP002184726.

C. Jacobsen et al; "Projection X-Ray Lithography Using Computer-Generated Holograms: A study of compatibility with proximity lithography"; Journal of Vacuum Science and Technology: Part B, Am Inst. of Physics, New York, US vol. 10. No. 6 (Nov. 1, 1992) pp. 3177-3181 XP00332529.

C. Jacobsen et al; "X-Ray Holographic Microscopy Using Photoresists", Journal of the Optical Society of America—A, Optical Society of America, Wash. US. vol. 7, No. 10 (Oct. 1, 1990) pp. 1847-1861 XP000163095.

Elliott, "Integrated Circuit Manufacturing Technology", pp 76-81 (1982).

Machine translation of Tetsuo et al., JP 11-329944.

Machine translation of Tetsuo et al., JP 06-283585.

J.C.H. Spence et al; *Low Energy Point Reflection Microscopy*, Surface Review and Letters, vol. 4, No. 3 (1997) pp 577-587.

J.C.H. Spence et al; *On the reconstruction of low voltage point projection holograms;* Electron Holography, (1995) pp 267-276.

Hans-Werner Fink et al; *State of the Art Low-Energy Electron Holography,* Electron Holography (1995) pp 257-266.

J.C.H. Spence et al; *Electron Holography at Low Energy,* Introduction to Electron Holography, pp 311-331.

D.C. Joy et al; *Advanced SEM Imaging,* Characterization and Metrology fur ULSI Technology; 1998 International Conference, pp 653-666.

Russel Young et al; *The Topografiner: An Instrument for Measuring Surface Microtopography,* Review of Scientific Instruments, vol. 43, No. 7, (Jul. 1972) pp 999-1011.

G. Morton et al; *Point Projector Electron Microscope,* Phy. Rev. vol. 56, 705 (1939).

* cited by examiner

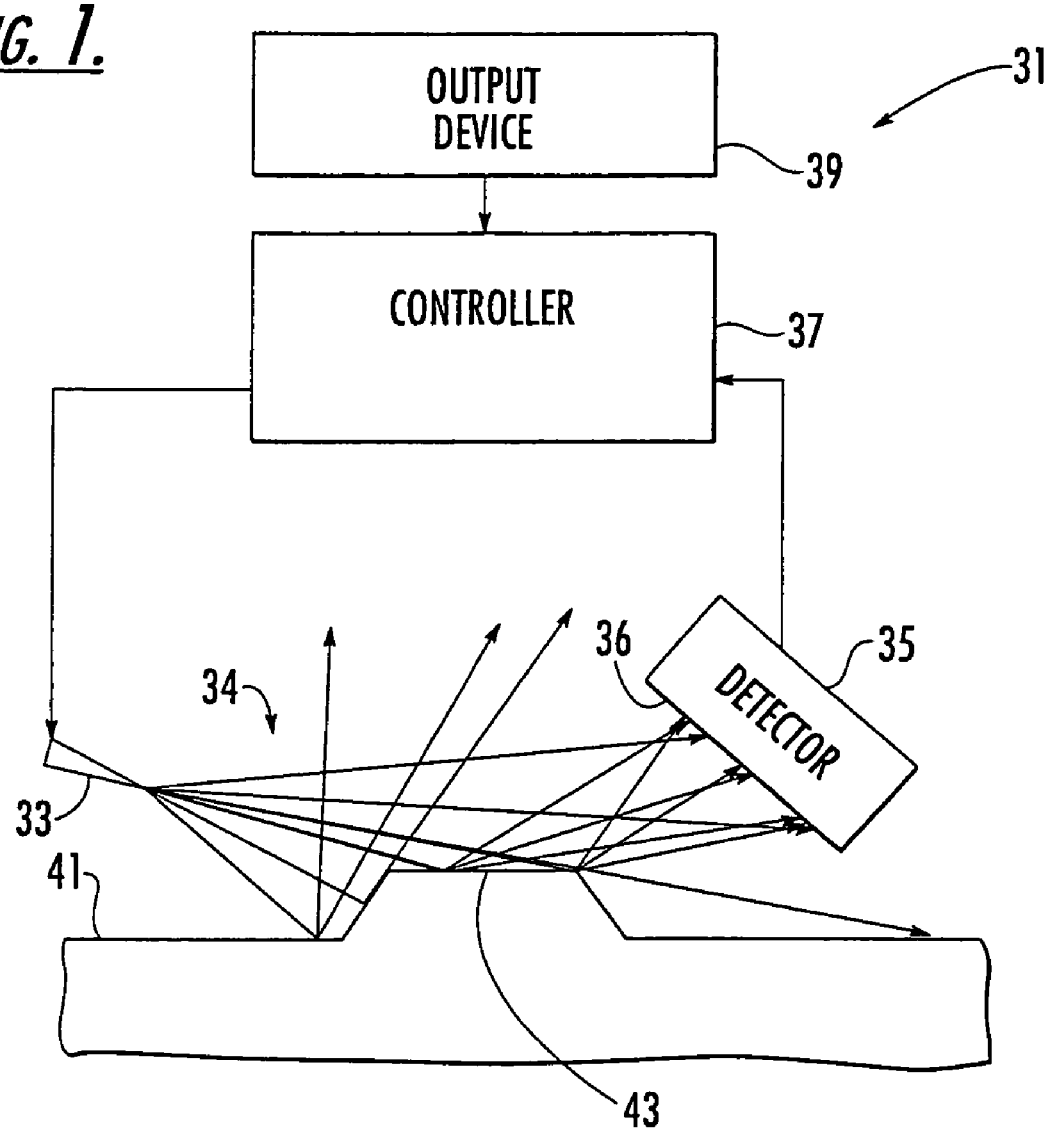

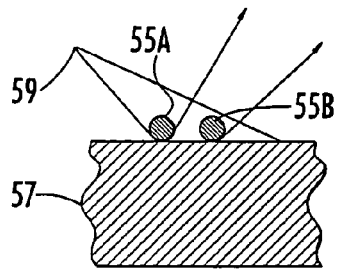
FIG. 3A.
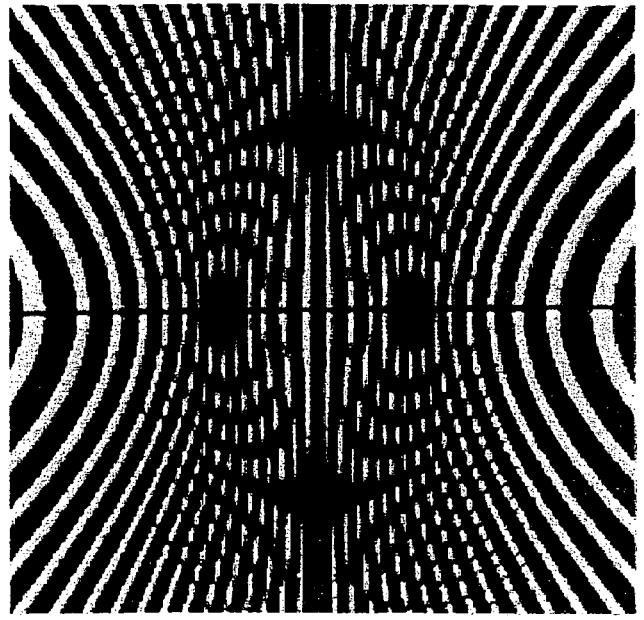
FIG. 3B.
FIG. 4B.
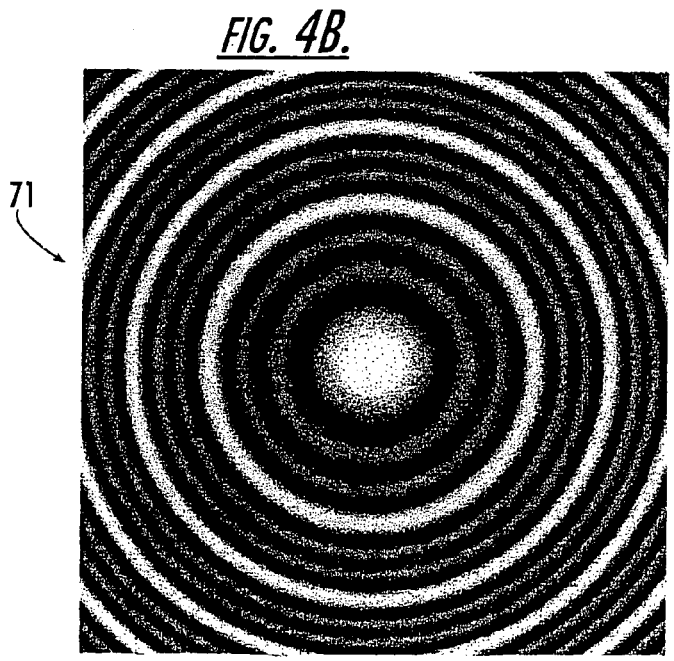
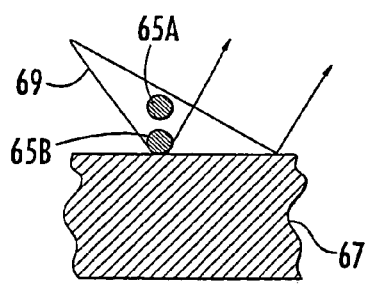
FIG. 4A.

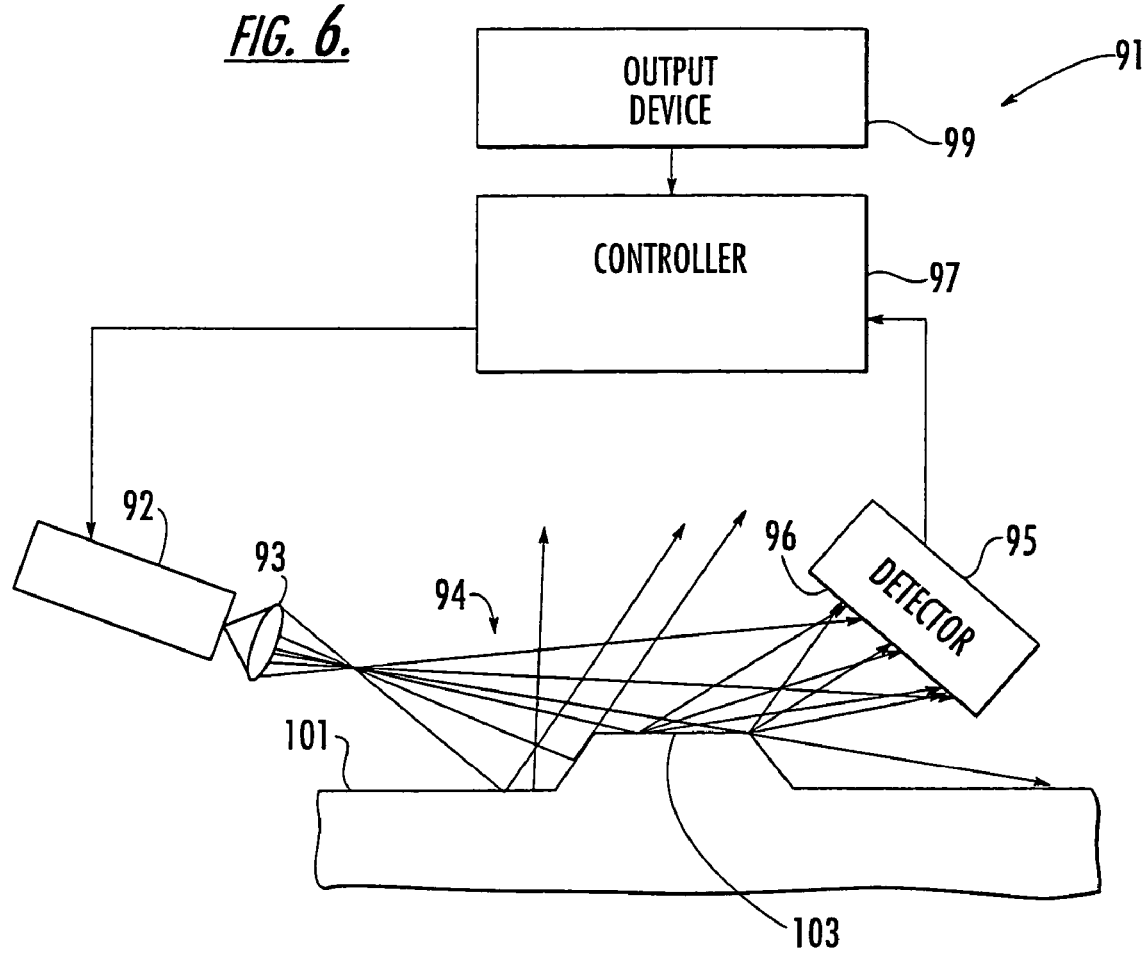

US 6,967,067 B2

PATTERNING METHODS AND SYSTEMS USING REFLECTED INTERFERENCE PATTERNS

RELATED APPLICATIONS

The present application is a continuation of and claims the benefit of priority from U.S. application Ser. No. 09/781,881 filed Feb. 12, 2001, now U.S. Pat. No. 6,730,443, which claims the benefit of priority from U.S. Provisional Application Ser. No. 60/185,288 filed Feb. 28, 2000. The disclosures of application Ser. Nos. 09/781,881 and 60/185,288 are hereby incorporated herein in their entirety by reference.

BACKGROUND OF THE INVENTION

The present invention relates to the field of microelectronics and more particularly to microelectronic patterning.

As integrated circuit devices become more highly integrated, dimensions of structures such as conductive lines and via holes and spaces therebetween are reduced. Accordingly, patterning processes are needed for smaller patterns. In the past, conventional optical lithography techniques have been used.

In optical lithography, an image of a pattern is optically projected onto a substrate by transmitting radiation through a mask including the pattern thereon. In essence, a pattern from a mask is projected onto a photosensitive material which is then developed so that the developed photosensitive material has the pattern of the mask. As the dimensions of microelectronic structures are further reduced, however, mask projection techniques may limit further reductions in pattern sizes.

Accordingly, there continues to exist a need in the art for improved patterning methods and systems.

SUMMARY OF THE INVENTION

According to embodiments of the present invention, a layer on a substrate can be patterned using interference patterns. For example, coherent radiation can be projected toward a reflector surface so that the coherent radiation is reflected off the reflector surface to provide a holographic projection of a desired image wherein the reflector surface includes information that corresponds to an inverse of the holographic projection of the desired image. The substrate including the layer can be maintained in the path of the reflected radiation so that the interference pattern is projected onto the layer. Accordingly, the holographic projection of the desired image can be used to patter the layer. For example, after maintaining the substrate including the layer in the path of the reflected radiation, the layer can be developed so that portions thereof are maintained and removed according to the intensity of the holographic projection of the desired image projected thereon.

Methods and systems according to embodiments of the present invention can thus provide patterning for microelectronic structures having relatively fine dimensions. Moreover, defect tolerance can be increased because the effect of a defect on the reflector surface is distributed throughout the interference pattern projected onto the surface of the layer being patterned.

BRIEF DESCRIPTION OF THE DRAWINGS

FIG. 1 is a block diagram of a reflective holographic microscope.

FIG. 3A is a cross-sectional view of two spheres on a silicon substrate subjected to coherent radiation.

FIG. 3B is a hologram computed using the coherent radiation of FIG. 3A.

FIG. 4A is a cross-sectional view of one sphere on a second sphere on a silicon substrate subjected to coherent radiation.

FIG. 4B is a hologram computed using the coherent radiation of FIG. 4A.

FIG. 6 is a block diagram of a reflective holographic microscope including a laser.

DETAILED DESCRIPTION

Figure 2B:
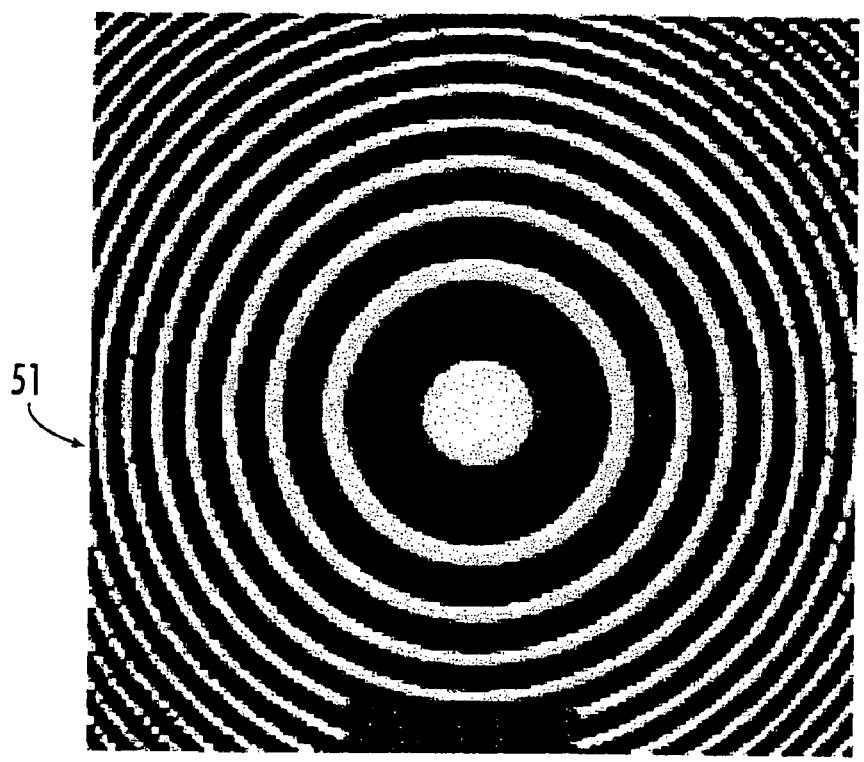
FIG. 2B is a hologram computed using the coherent radiation of FIG. 2A.

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

It will be understood that when an element such as a layer, region, or substrate is referred to as being "on" another element, it can be directly on the other element or intervening elements may also be present. In contrast, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. In the drawings, the dimensions of layers and regions are exaggerated for clarity.

A block diagram illustrating a reflective holographic microscope 31 and methods used to characterize a sample surface 41 is shown in FIG. 1. As shown, the microscope can include a source of coherent radiation 33, a detector 35, a controller 37, and an output device 39. The radiation source 33 projects coherent radiation 34 along divergent paths toward the sample surface 41 so that the coherent radiation is reflected or scattered off the sample surface 41. The detector 35 defines an interference plane 36 to detect an interference pattern generated by the reflected and unreflected portions of the coherent radiation 34 incident on the interference plane. In particular, the detector may detect both amplitude and phase information of radiation incident on the interference plane 36 to provide a measurement of an interferogram or Fresnel hologram resulting from interference of the reflected and unreflected portions of the coherent radiation at the interference plane. For example, the detector 35 may be a charge coupled device (CCD) that generates a digital representation of the radiation incident on the interference plane. Alternately, other detectors known now or developed in the future may be used.

Measurements of the reflected and unreflected portions of the coherent radiation can then be provided by the detector 35 to the controller 37. The controller can use the amplitude and phase information included in these measurements to reconstruct a three-dimensional image of the sample surface 41. The three-dimensional image can be displayed on an output device 39 such as a CRT or LCD screen or a printer. Alternately or in addition, the controller can use the amplitude and phase information to make measurements of particular features of the sample surface. As shown in FIG. 1, the sample surface may include a raised portion 43 such as a gate electrode, a conductive line, or an isolation region, and it may be desirable to determine a width of the raised portion 43. The controller can use the amplitude and phase information to determine a width of the raised portion. In addition, heights and/or shapes of raised portions can be determined. Alternately or in addition, widths, depths, and/or shapes of trenches or holes can be determined.

The controller can use geometric calculations based on the amplitude and phase information to reconstruct the three-dimensional image of the sample surface. As will be understood by those having skill in the art, the controller can be implemented using special purpose hardware-based systems, general purpose computer systems together with computer instructions, and/or combinations of special purpose and general purpose systems. As will be further understood, the controller can be implemented using one or more integrated circuit devices, combinations of discrete circuit devices, and/or combinations of discrete and integrated circuit devices. Moreover, while the detector 35 and the controller 37 are illustrated as separate blocks in FIG. 1, it will be understood that the detector could be implemented as a portion of the controller, or the detector could be implemented as a separate block including functionality discussed above as being performed by the controller. The controller 37 can also be used to maintain relative positions of the radiation source 33, the sample surface 41, and the detector 35.

According to a particular embodiment of the present invention, the radiation source 33 can project a coherent beam of electrons. For example, the radiation source 33 can be a field emitter that emits an electron beam in response to a voltage applied thereto. In particular, the radiation source can be a nanotip field emitter wherein the tip has dimensions on the order of an atom. By providing a nanotip with these dimensions, a coherent electron beam can be generated by applying a voltage difference between the radiation source and the sample surface 41.

The preparation of a single-atom tip from W [111]-oriented single crystal wires is discussed, for example, in the reference by Hans-Werner Fink et al. entitled *State Of The Art Of Low-Energy Electron Holography*, Electron Holography, A. Tonomura et al. (Editors), Elsevier Science B. V., 1995. The Fink et al. reference also discusses the generation of a beam of coherent electrons using the single-atom tip. The Fink et al. reference is hereby incorporated herein in its entirety by reference. The voltage difference between the radiation source 33 and the sample surface 41 can be generated using the controller 37 as shown in FIG. 1. According to another example, a nanotip could be provided using a carbon nanotube.

A reflective holographic microscope can be provided, for example, by fitting a nanotip emitter into a scanning electron microscope (SEM) such as a Hitachi CD-SEM. Using a tungsten nanotip emitter as discussed in the Fink et al. reference, for example, an effective tip radius of less than 3 nm can be provided, and turn on energies can be provided in the range of 60V to 100V. The resulting emission current can be varied from less than 1 nA to nearly 1 $\mu$A for extraction voltages in the range of 60V to 500V, and a brightness of $10^7$ Amp/cm$^2$/str. at 500 eV can be provided. Moreover, an emission stability of less than 5% can be provided at a pressure of $10^{-8}$ torr for over a one minute period.

According to a particular example of the present invention, a relatively low energy of less than 100 eV can be applied between the radiation source 33 and the sample surface 41 to generate the divergent beam 34 of coherent electrons. The divergent beam 34 can thus provide an illumination footprint in the range of 20 $\mu$m to 30 $\mu$m in diameter on the sample surface. The electrons in the divergent beam 34 are elastically scattered at the sample surface 41 by reflection from the inner potential of the sample, and reflected (scattered) and unreflected (unscattered) portions of the divergent beam interfere to provide the interferogram (Fresnel hologram) at the interference plane 36. Because the interference plane is provided downstream from the radiation source 33, the resulting hologram can be referred to as a forward scatter hologram.

Because the resolution of an electron hologram is determined by the wavelength of the electrons used to form the hologram, very high resolutions can be provided. In particular, a resolution on the order of three times the wavelength of the electrons can be provided. Accordingly, a resolution of less than one nanometer may be possible using an electron beam energy of 50 eV. Moreover, there may be little or no diffraction limit because the incident beam is divergent. In addition, lens aberrations and/or distortions can be reduced or eliminated because no lenses are required.

Radiation damage to the sample surface and charging of the sample surface can be reduced when compared to systems such as a scanning electron microscope. First, the damage and charging can be reduced because the electron beam can be generated using relatively low energies of less than 100 eV. Second, the damage and charging can be reduced because the divergent beam is spread over a relatively wide area as compared to more focused beams used in scanning electron microscopes. An additional potential advantage of the reflective holographic microscope of FIG. 1 is that the hologram can be a more robust format for data than a conventional image because the resulting phase and amplitude information can provide more information. Furthermore, the reflective holographic microscope of FIG. 1 does not require focusing, and a wide range of magnifications can be provided without significant adjustment.

While examples of reflective holographic microscopes and methods of FIG. 1 are discussed as including a radiation source that generates a divergent beam of coherent electrons to provide an electron hologram, other sources of radiation may be used. For example, a laser can be used to provide a divergent beam of coherent light.

As discussed above with regard to FIG. 1, reflective holographic microscopes and methods can be used to generate images of and/or measure dimensions of a surface feature of a sample. A reflective holographic microscope can thus be used for critical dimension (CD) metrology for microelectronic processing to verify sizes and spacings of microelectronic structures.

A reflective holographic microscope can also be used for defect detection in microelectronic processing. In general, an interference pattern generated by a defect such as a particle will be distinct with respect to an interference pattern generated by an intended microelectronic structure such as a gate electrode or a conductive line. Accordingly, a reflective holographic microscope can be used to detect defects and provide a measure of a defect density. FIGS. 2–5 illustrate examples of holograms produced by a particle(s) on a smooth substrate when analyzed using a reflective holographic microscope.

Figure 2A:
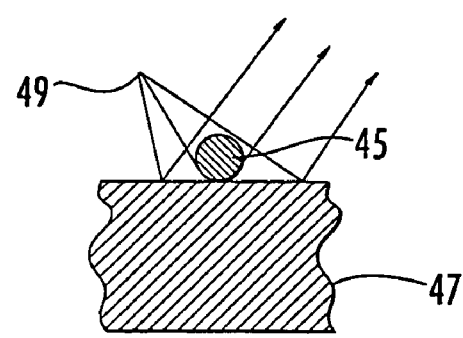
FIG. 2A is a cross-sectional view of a sphere on a silicon substrate subjected to coherent radiation.

In FIG. 2A, a single 5 nm sphere 45 on the surface of a silicon wafer 47 subjected to coherent electron beam 49 at 50 eV can generate the computed hologram 51 with 100×100 pixels shown in FIG. 2B. As discussed above, the hologram is an interference pattern of reflected and unreflected components of the coherent radiation 34. The hologram generally is not an image, so reconstruction is needed to generate an image of the sphere. A spherical particle defect on a silicon wafer would thus produce a similar interference pattern which could be readily identified to determine a defect density.

In FIG. 3A, two 5 nm spheres 55A and 55B are on a silicon substrate 57 spaced by 5 nm. The two 5 nm spheres can be subjected to coherent electron beam 59 at 50 eV to generate the computed hologram 61 shown in FIG. 3B. The extra fringes carry information that can be used to determine the spacing and relative positions of the two spheres. Two spherical particle defects on a silicon wafer would thus produce a similar interference pattern.

Figure 5A:
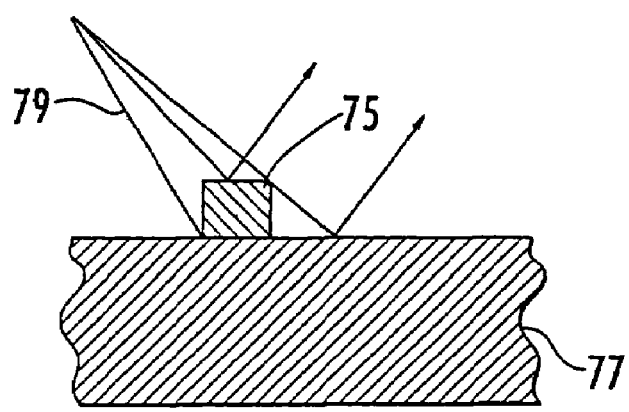
FIG. 5A is a cross-sectional view of a cube on a silicon substrate subjected to coherent radiation.
Figure 5B:
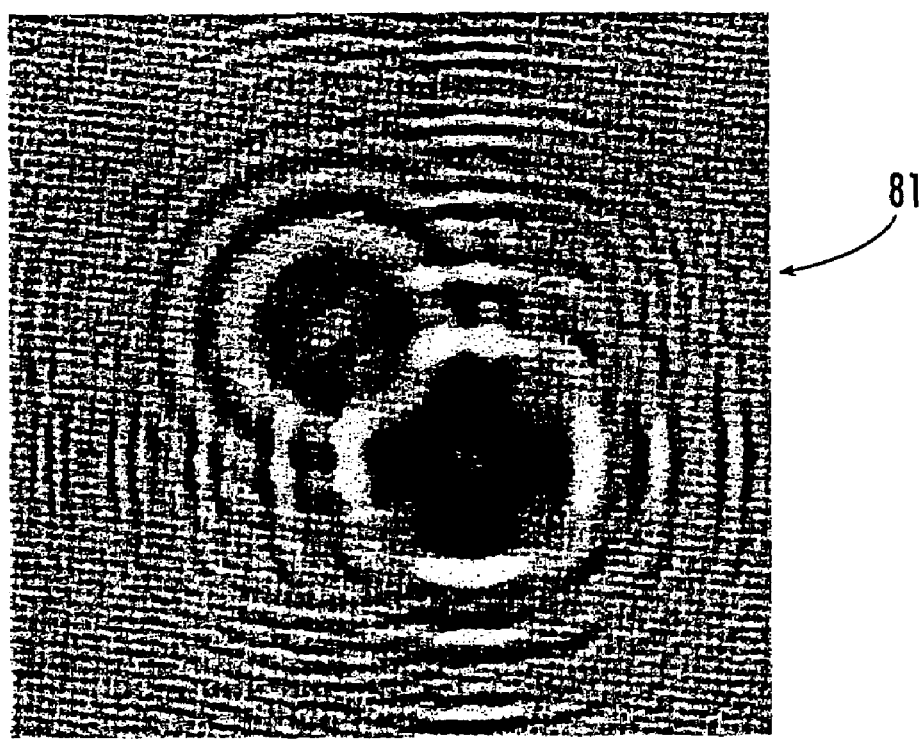
FIG. 5B is a hologram computed using the coherent radiation of FIG. 5A.

In FIG. 4A, two 5 nm spheres 65A and 65B are placed 5 nm apart, one above the other with respect to a silicon substrate 67. The two 5 nm spheres can be subjected to coherent electron beam 69 to generate the computed hologram 71 shown in FIG. 4B. In FIG. 5A, a 5 nm cube 75 on a silicon substrate 77 can be subjected to coherent electron beam 79 to generate the computed hologram 81 shown in FIG. 5B. As shown in FIGS. 2–5, holograms generated using a coherent electron beam can be used to identify, characterize, and/or quantify defects on a substrate surface.

A reflective holographic microscope 91, using a laser 92 as a source of coherent radiation, is illustrated in FIG. 6. In particular, a divergent beam of coherent radiation 94 can be generated using laser 92 and short focal length lens 93. Portions of the divergent beam of coherent radiation 94 reflect off the sample surface 101 including the raised portion 103, and reflected and unreflected portions provide an interferogram or hologram at the interference plane 96 of the detector 95. The detector 95 provides a measure of the interferogram to the controller 97 which can reconstruct a three-dimensional image of the sample surface. The three-dimensional image can be provided on the output device 99, and the laser 92 can operate responsive to the controller 97.

Figure 7:
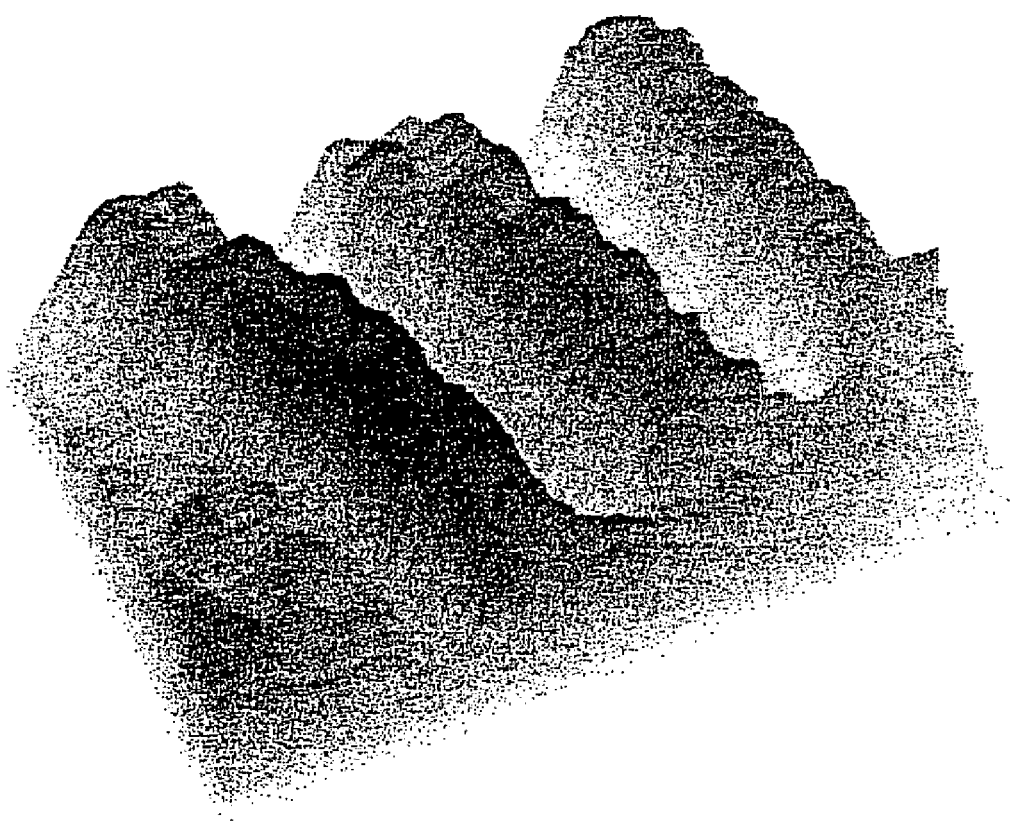
FIG. 7 is a reconstructed image generated using off-axis holography.

FIG. 7 illustrates a reconstructed image generated by a point projection microscope as discussed above. More particularly, the image of FIG. 7 is a three dimensional reconstruction of approximately 100 nm features on a SCALPEL mask performed using off-axis holography.

While reflective holographic microscopes have been discussed with respect to coherent radiation such as coherent electron and laser beams, it will be understood that any form of coherent radiation can be used in reflective holographic microscopes.

Figure 8:
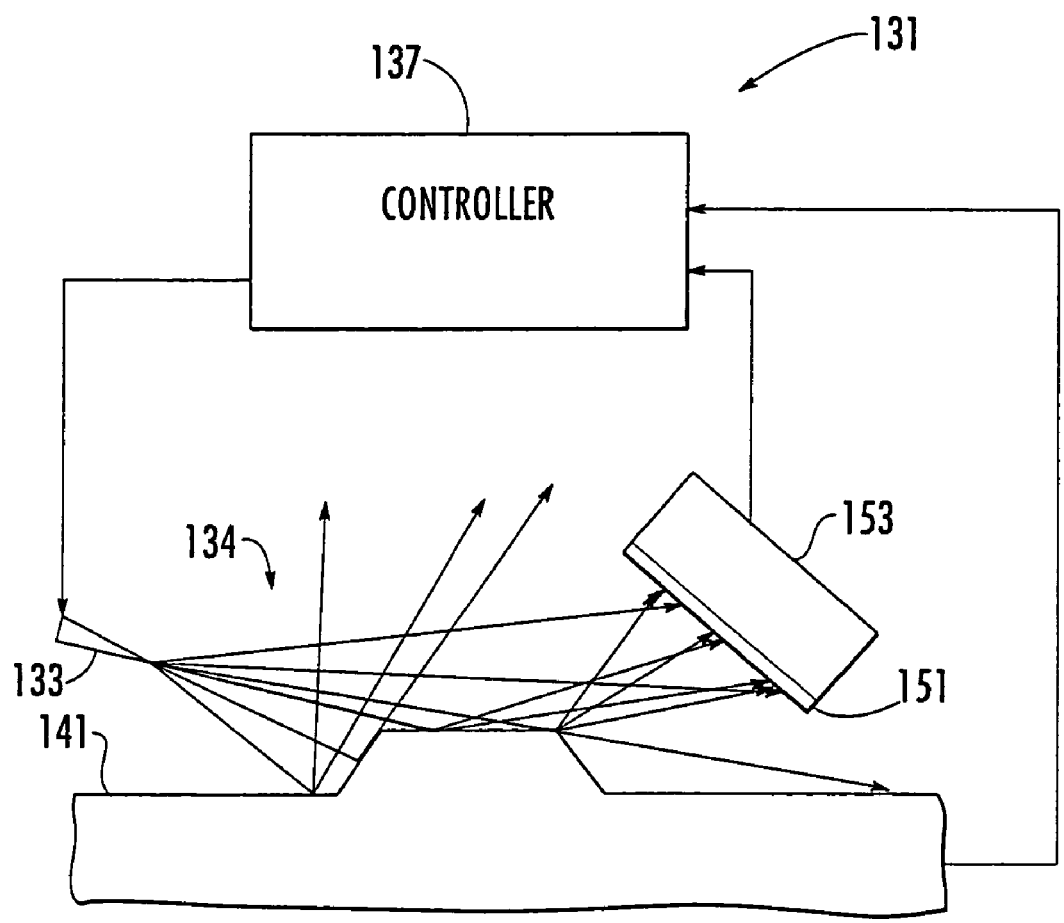
FIG. 8 is a block diagram of a patterning system.

Interference patterns can also be used to provide patterning for microelectronic structures. Examples of systems and methods using interference patterns for patterning are illustrated in FIG. 8. As shown, a patterning system 131 can be used to pattern a layer 151 of a microelectronic structure 153. In particular, the patterning system can include a source of coherent radiation 133, a patterning reflector having a surface 141, and a controller 137. The radiation source 133 generates a divergent beam of coherent radiation 134, portions of which are reflected off the surface 141 of the patterning reflector wherein the surface 141 includes information that corresponds to an inverse holographic projection used to pattern the layer 151. Portions of the coherent radiation can also be transmitted to the layer 151 without reflecting off the reflector surface 141 to interfere with the portions of the coherent radiation reflected off the reflector surface.

The layer 151 to be patterned is placed in the path of reflected and unreflected portions of the coherent radiation 134 to define an interference plane. Accordingly, a Frenel hologram or interferogram can be defined on the layer 151 as reflected and unreflected portions of the coherent radiation 134 interfere at the layer 151. Portions of the layer 151 can be selectively maintained and removed depending on the intensity of the hologram thereon. For example, the layer 151 can be a layer of a photosensitive material, such as photoresist, that can be chemically developed so that portions thereof are removed or maintained depending on the intensity of the radiation interference pattern incident thereon. The patterned photoresist can then be used as a patterning mask to selective etch an underlying layer of a device functional material.

Alternately, the patterning system 131 can be used to directly pattern a layer of a device functional material without using a photoresist layer. For example, the layer 151 can be a layer of silicon oxide (or other device functional material) on the order of two atoms thick, and portions of the silicon oxide layer can be removed by relatively high intensity portions of the hologram or interferogram formed thereon. The surface 141 of the patterning reflector thus determines the hologram or interferogram formed on the layer 151, so that different surface patterns of the patterning reflector can be used to define different patterns in the layer 151.

Figure 9:
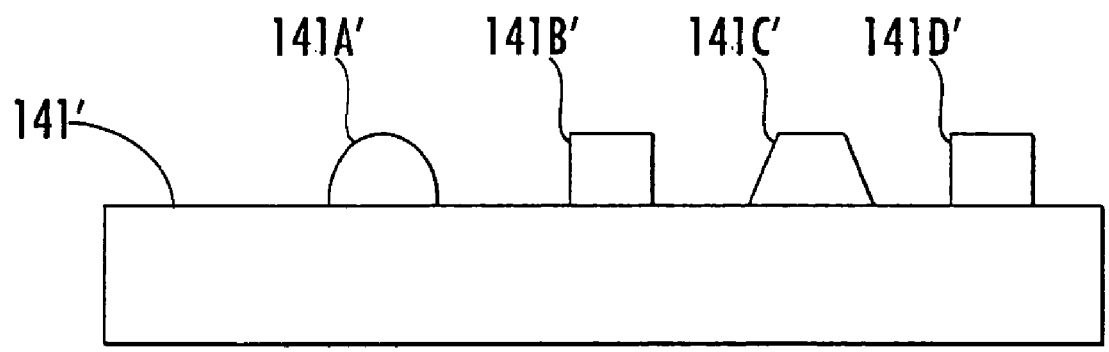
FIG. 9 is a cross sectional view of a reflector including a plurality of topographical features.

The cross-sectional view of the patterning reflector surface 141 illustrated in FIG. 8 is provided by way of example with a single topographical feature to show how the divergent beam of coherent radiation 134 can react with features of the reflector surface 141. It will be understood, however, that a reflector surface 141' for the patterning system can have numerous topographical features 141A'–D' of different shapes as shown in FIG. 9. Moreover, the numerous topographical features can be arranged in various patterns such as dots and/or circles across the reflector surface.

While the reflector surfaces 141 and 141' are shown with topographical features being used to generate interference patterns, other characteristics of reflector surfaces can be used to generate a desired interference pattern. For example, the reflector surface may be provided with areas of differing reflective/absorption properties; areas of differing compositional density; areas of differing electrostatic properties; areas of differing magnetic properties; and/or areas of differing topology. More generally, any variation in properties of the reflector surface that provide different reflective properties can be used to generate the interference pattern.

By way of example, an intensity distribution across a beam of coherent radiation projected toward the reflector surface can be arbitrarily adjusted by generating an interference pattern with a bi-prism or other electrostatic or magnetic devices. The intensity and phase information in the patterning wave front will depend on the interaction of an unreflected portion of the coherent beam transmitted directly from the source 133 to the layer 151 and a portion of the coherent beam reflected off the reflector surface. The patterning wave front at the layer 151 contains specific spatial and structural information to be transformed into specific two-dimensional and/or three-dimensional structures on the layer 151. Accordingly, the reflective surface contains sufficient information, such that when the coherent beam reflects off the reflecting surface and interferes with a non-reflected portion of the coherent beam, an image can be patterned into the layer 151, whether the layer 151 is a photoresist or a device functional material such as, for example, silicon, an oxide, a nitride, or a metal.

The substrate surface including the layer 151 can be maintained in the path of the reflected radiation so that the interference pattern is projected onto the substrate surface including the layer. After maintaining the substrate surface including the layer in the path of the reflected and non-reflected radiation, the layer can be developed so that portions thereof are maintained and removed according to the intensity of the interference pattern thereon.

As will be understood by those having skill in the art, the controller can be implemented using special purpose hardware-based systems, general purpose computer systems together with computer instructions, and/or combinations of special purpose and general purpose systems. As will be further understood, the controller can be implemented using one or more integrated circuit devices, combinations of discrete circuit devices, and/or combinations of discrete and integrated circuit devices. The controller can also be used to maintain relative positions of the radiation source 133, the reflector surface 141, and the microelectronic structure 153.

According to a particular example of FIG. 8, the radiation source 133 can project a coherent beam of electrons. For example, the radiation source can be a field emitter that emits an electron beam in response to a voltage applied thereto. In particular, the radiation source can be a nanotip field emitter wherein the tip has dimensions on the order of an atom. By providing a nanotip with these dimensions, a coherent electron beam can be generated by applying a voltage difference between the radiation source and the reflector surface 141.

The preparation of a single-atom tip from W [111]-oriented single crystal wires is discussed, for example, in the reference by Hans-Werner Fink et al. entitled *State Of The Art Of Low-Energy Electron Holography, Electron Holography*, A. Tonomura et al. (Editors), Elsevier Science B. V., 1995. The Fink et al. reference also discusses the generation of a beam of coherent electrons using the single-atom tip. The Fink et al. reference is hereby incorporated herein in its entirety by reference. The voltage difference between the radiation source 133 and the sample surface 141 can be generated using the controller 137 as shown in FIG. 8. According to another example, a nanotip could be provided using a carbon nanotube.

A relatively low energy of less than 100 eV can be applied between the radiation source 133 and the sample surface 141 to generate the divergent the divergent beam 134 of coherent electrons. The electrons in the divergent beam 134 are elastically scattered at the reflector surface 141 by reflection from the inner potential of the surface, and reflected (scattered) and unreflected (unscattered) portions of the divergent beam interfere to provide the interference pattern (such as an interferogram or Frenel hologram) at the layer 151 being patterned. Because the interference pattern is generated downstream from the radiation source 133 the resulting interference pattern can be referred to a forward scatter hologram.

Because the resolution of an electron hologram is determined by the wavelength of the electrons used to form the hologram, very high resolution can be provided. In particular, resolution on the order of thee times the wavelength of the electrons can be provided. Accordingly, a resolution of less than one nanometer may be possible using an electron beam energy of 50 eV. Moreover, there may be little or no diffraction limit because the incident beam is divergent. In addition, lens aberrations and/or distortions can be reduced or eliminated because no lenses are required.

While examples of a patterning system and methods of FIG. 8 are discussed as including a radiation source that generates a divergent beam of coherent electrons to provide an electron hologram, other sources of radiation may be used. For example, a laser can be used to provide a divergent beam of coherent light. According to this example, the radiation source might include a laser and a short focal length lens to provide a divergent beam of coherent radiation.

Patterning using interference patterns as discussed above may provide tolerance to defects on the reflecting surface 141. Defects in the reflecting surface 141 are expected to exhibit structures and signatures in Fourier space different than the structures and signatures of the intended pattern. These defect signatures can thus be separated and/or filtered in Fourier space. Moreover, any defect information may be convolved with the entire set of phase and amplitude information that impinges on the imaged layer 151. Accordingly, defect information may be diluted across the imaged surface. Accordingly, in the transformation from reflector information to imaged information, small defects on the reflector surface 141 may not print on the layer 151. Methods and systems according to embodiments of the present invention can thus provide defect tolerant patterning for microelectronic structures with relatively fine dimensions.

A controller 137 can be used to control the duration and intensity of the coherent radiation 134. The controller can also be used to maintain relative positions of the radiation source 133, the reflector surface 141, and the microelectronic structure 153. As discussed above with regard to the microscope of FIGS. 1 and 6, the radiation source 133 can be an electron emitter, a laser, or source of other coherent radiation.

Figure 10:
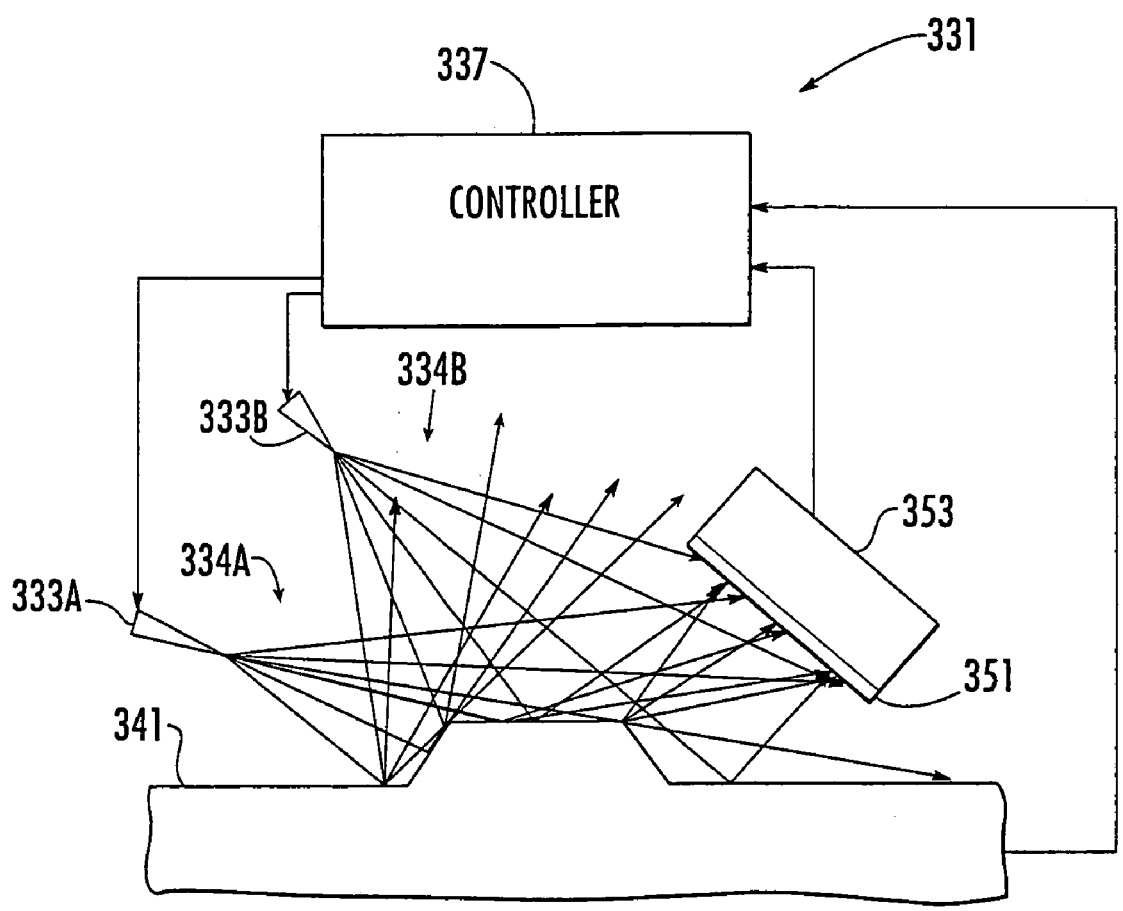
FIG. 10 is a block diagram of a patterning system including a plurality of radiation sources.

Alternate reflective patterning methods and systems 331 are illustrated in FIG. 10 including a reflector surface 341, a plurality of radiation sources 333A–B, and a controller 337 used to pattern layer 351 of substrate 353. As shown, the reflective patterning system 331 may include a plurality of radiation sources 333A–B to generate a corresponding plurality of beams of coherent radiation 334A–B. Portions of each of the beams of coherent radiation are transmitted directly to the layer 351 to be patterned, and portions of the beams are reflected off the reflector surface 341 to the layer 351. With a plurality of radiation sources, each radiation source can be used to transmit different information to pattern the layer 351, and/or the intensity of the interference pattern(s) at the layer 351 can be increased to increase throughput.

Figure 11:
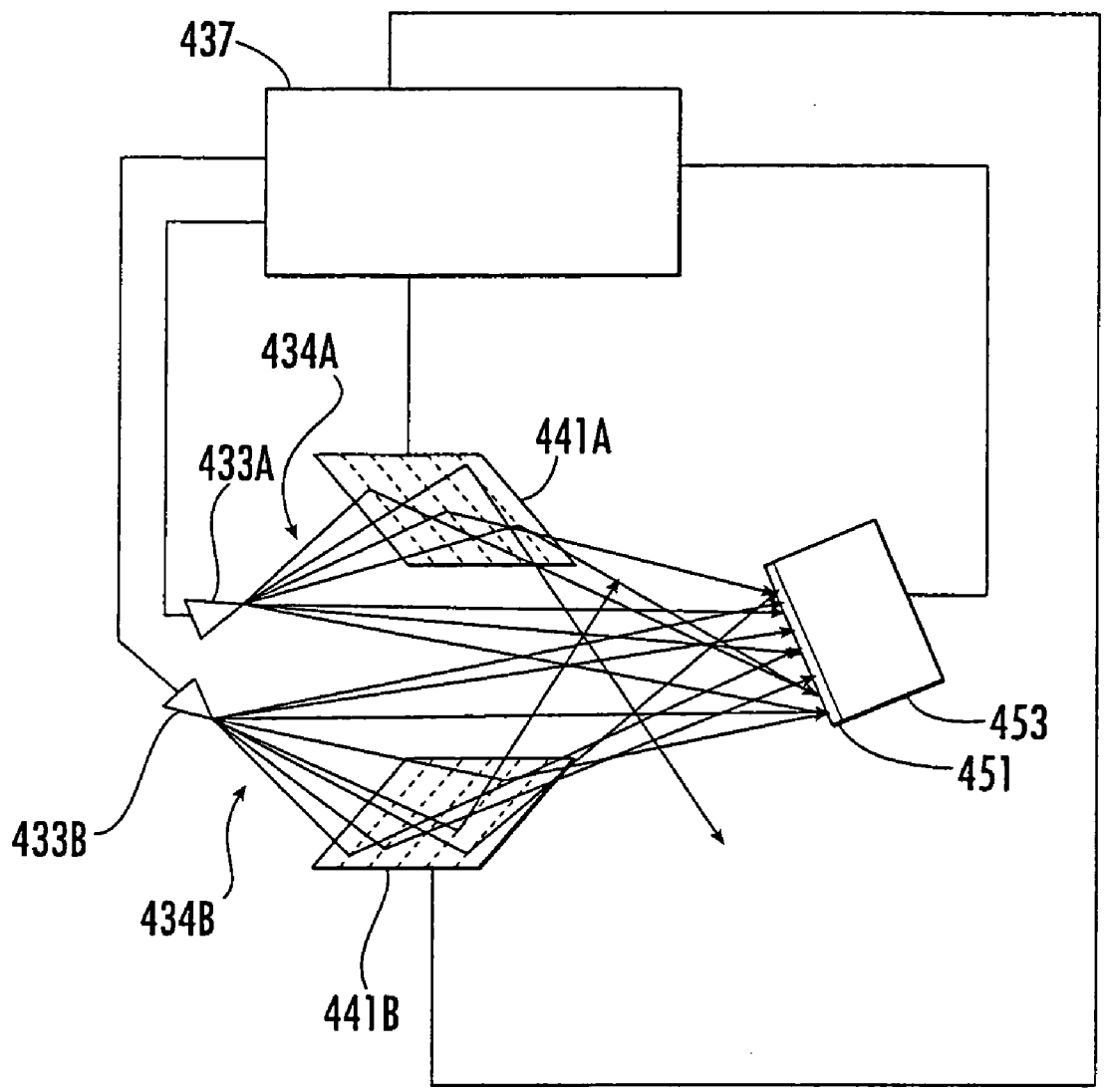
FIG. 11 is a block diagram of a patterning system including a plurality of patterning reflectors and a plurality of reflectors.
Figure 12:
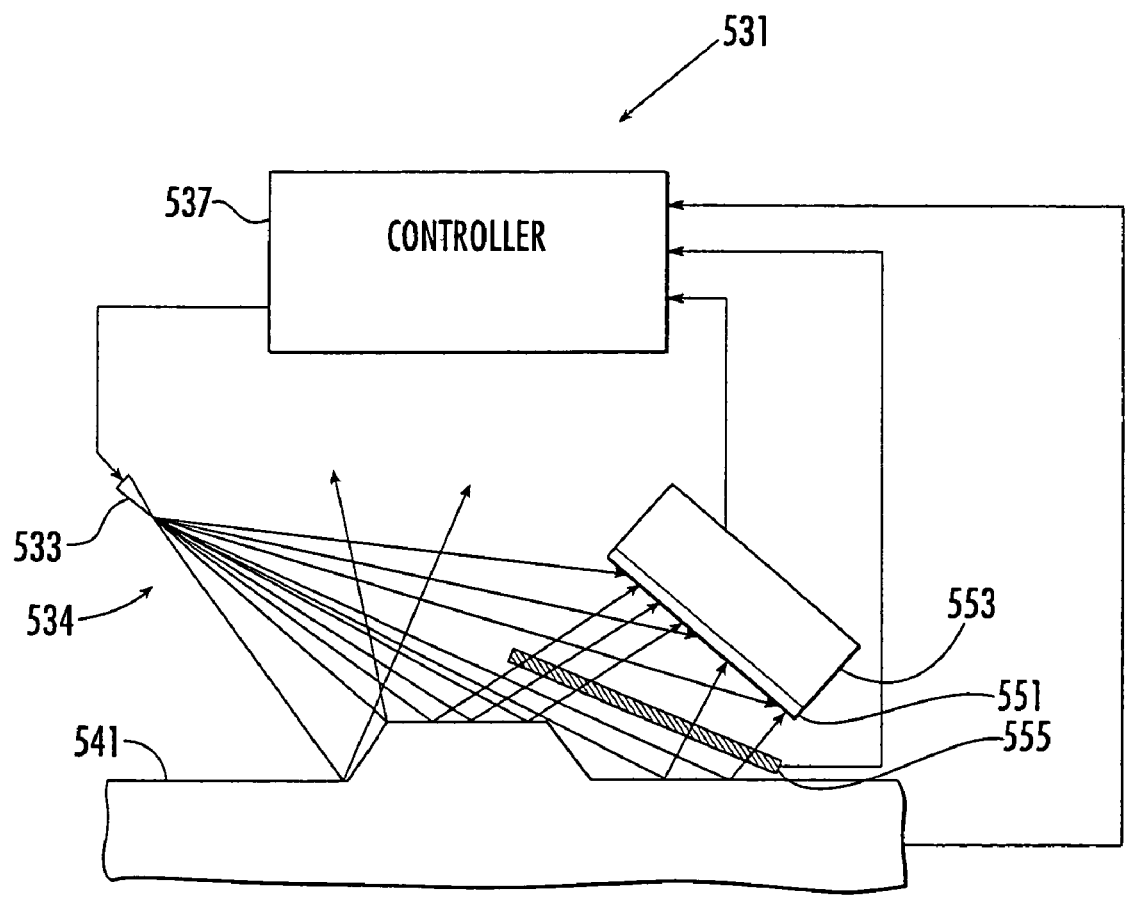
FIG. 12 is a block diagram of a patterning system including a filter.

Additional reflective patterning methods and systems 441 are illustrated in FIG. 11 including a plurality of reflector surfaces 441A–B, a plurality of radiation sources 433A–B, and a controller 437 used to pattern layer 451 of substrate 453. As shown, the reflective patterning system 431 may include a plurality of radiation sources 433A–B to generate a corresponding plurality of beams of coherent radiation 434A–B. Portions of each of the beams of coherent radiation are transmitted directly to the layer 451 to be patterned, and portions of the beams are reflected off the respective reflector surfaces 441A–B to the layer 451. With a plurality of radiation sources and reflectors, each combination of radiation source and reflector can be used to transmit different information to pattern the layer 451, and/or the intensity of the interference pattern(s) at the layer 451 can be increased to increase throughput.

Yet other reflective patterning methods and systems 541 are illustrated in FIG. 11 including a reflector surface 541, a radiation source 533A–B, a filter 555, and a controller 537 used to pattern layer 551 of substrate 553. As shown, the reflective patterning system 531 may include a radiation source 533 to generate a beam of coherent radiation 534. Portions of the beam of coherent radiation are transmitted directly to the layer 451 to be patterned, and portions of the beam are reflected off the reflector surface 541 to the layer 551. More particularly, portions of the beam reflected off the reflector surface 541 to the layer 551 can be transmitted though filter 555 to reduce the generation of defects in the layer 551 being patterned resulting from defects in the reflector surface 541.

As discussed above, defects in the reflector surface can be expected to have structures and signatures in Fourier space different than those of the desired patterns in the reflector surface. Accordingly, the filter 555 can separate and/or filter defect signatures in reflected portions of the beam to reduce resulting defects in the layer being patterned. The filter, for example, can be an electrostatic or electromagnetic filter that shapes the reflected portions of an electron beam to reduce defect signatures. If the radiation beam is an optical beam, the filter can be an optical lens. Moreover, filters can be used in patterning systems including multiple radiation sources and/or reflector surfaces. The system of FIG. 10, for example, could include one or more such filters to filter radiation reflected from the reflector surface toward the layer 351. The system of FIG. 11 could include one or more filters between each of the reflector surfaces and the layer 451.

In addition, the patterning methods and systems of FIGS. 8, 10, 11 and 12 may be configured to accept different reflectors to allow patterning of different layers and/or devices. In other words, a first reflector(s) could be used to pattern on first layer of a device and a second reflector(s) could be used to pattern a second layer of the same device. Alternatively, a first reflector(s) could be used to pattern a first layer of a first device, and a second reflector(s) could be used to pattern a second layer of a second device.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method for patterning a layer on a substrate with a desired projection image, the method comprising the steps of:
   providing a reflector surface that has been patterned to include variation in a property thereof providing information that corresponds to the desired projection image;
   projecting a coherent beam of electrons toward the reflector surface so that a portion of the coherent beam of electrons is reflected off the reflector surface;
   projecting a portion of the coherent beam of electrons to the layer without reflecting off the reflector surface; and
   maintaining the substrate including the layer in the path of the reflected radiation and in the path of the portion of the coherent beam of electrons projected without reflecting off the reflector surface so that the reflected portions of the coherent beam of electrons and portions of the coherent beam of electrons projected without reflecting off the reflector surface interfere to provide a holographic projection of the desired projection image and so that the holographic projection of the desired projection image is projected onto the layer to thereby pattern the layer with the desired projection image.

2. A method according to claim 1 further comprising the step of:
   developing the layer so that portions thereof are maintained or removed according to the intensity of the holographic projection of the desired projection image thereon.

3. A method according to claim 1 wherein the layer comprises an oxide layer that is activated on exposure to portions of the holographic projection of the desired projection image having sufficient intensity, so that activated portions of the oxide layer can be selectively removed, maintained, or modified.

4. A method according to claim 1 wherein the layer comprises a silicon layer that is activated on exposure to portions of the holographic projection of the desired projection image having sufficient intensity, so that activated portions of the silicon layer can be selectively oxidized or modified.

5. A method according to claim 1 wherein the step of projecting coherent beam of electrons further comprises generating the coherent beam of electrons from a nanotip field emitter.

6. A method according to claim 5 wherein the nanotip field emitter comprises a tip having dimensions on the order of an atom.

7. A method according to claim 1 wherein the holographic projection of the desired projection image comprises a Fresnel hologram.

8. A method according to claim 1 further comprising:
   filtering the coherent beam of electrons reflected off the reflector surface to reduce transmission of portions of the interference pattern corresponding to defects on the reflector surface.

9. A method according to claim 1 wherein projecting the coherent beam of electrons comprises projecting two coherent beams of electrons toward the reflector surface.

10. A method according to claim 1 further comprising:
    projecting coherent radiation toward a second reflector surface so that the coherent radiation is reflected off the second reflector surface to provide a second holographic projection of reflected radiation;
    wherein maintaining the substrate further comprises maintaining the substrate including the layer in the path of the radiation reflected off the second reflector surface so that the second holographic projection is projected onto the layer.

11. A method according to claim 1 further comprising:
    projecting a portion of the coherent beam of electrons to the layer without reflecting off the reflector surface.

12. A method for patterning a layer on a substrate with a desired projection image, the method comprising the steps of:
providing a reflector surface that has been patterned to include variation in a property thereof providing information that corresponds to the desired projection image;
projecting coherent radiation along divergent paths toward the reflector surface so that the coherent radiation is reflected off the reflector surface;
projecting a portion of the coherent radiation to the layer without reflecting off the reflector surface; and
maintaining the substrate including the layer in the path of the reflected radiation and in the path of the portion of the coherent radiation projected without reflecting off the reflector surface so that the reflected radiation and the coherent radiation projected without reflecting off the reflector surface interfere to provide a holographic projection of the desired projection image and so that the holographic projection of the desired projection image is projected onto the layer to thereby pattern the layer with the projection desired image.

13. A method according to claim 12 further comprising the step of:
developing the layer so that portions thereof are maintained or removed according to the intensity of the holographic projection of the desired projection image thereon.

14. A method according to claim 12 wherein the layer comprises an oxide layer that is activated on exposure to portions of the holographic projection of the desired projection image having sufficient intensity, so that activated portions of the oxide layer can be selectively removed, maintained, or modified.

15. A method according to claim 12 wherein the layer comprises a silicon layer that is activated on exposure to portions of the holographic projection of the desired projection image having sufficient intensity, so that activated portions of the silicon layer can be selectively oxidized or modified.

16. A method according to claim 12 wherein the step of projecting coherent radiation further comprises generating the coherent beam of electrons from a nanotip field emitter.

17. A method according to claim 16 wherein the nanotip field emitter comprises a tip having dimensions on the order of an atom.

18. A method according to claim 12 wherein the step of projecting coherent radiation comprises projecting laser radiation.

19. A method according to claim 12 wherein the holographic projection of the desired projection image comprises a Fresnel hologram.

20. A method according to claim 12 further comprising:
filtering the coherent radiation reflected off the reflector surface to reduce transmission of portions of the interference pattern corresponding to defects on the reflector surface.

21. A method according to claim 12 wherein projecting coherent radiation comprises projecting two beams of coherent radiation toward the reflector surface.

22. A method according to claim 12 further comprising:
projecting coherent radiation toward a second reflector surface so that the coherent radiation is reflected off the second reflector surface to provide a second holographic projection of reflected radiation;
wherein maintaining the substrate further comprises maintaining the substrate including the layer in the path of the radiation reflected off the second reflector surface so that the second holographic projection is projected onto the layer.

23. A system for patterning a layer on a substrate with a desired projection image, the system comprising:
a reflector surface that has been patterned to include variation in a property thereof providing information that corresponds to the desired projection image;
means for projecting a coherent beam of electrons toward the reflector surface so that a portion of the coherent beam of electrons is reflected off the reflector surface;
means for projecting a portion of the coherent beam of electrons to the substrate including the layer without reflecting off the reflector surface; and
means for maintaining the substrate including the layer in the path of the reflected portion of the coherent beam of electrons reflected and in the path of the portion of the coherent beam of electrons projected without reflecting off the reflector surface so that the reflected portion of the coherent beam of electrons and the portion of the coherent beam of electrons projected without reflecting off the reflector surface interfere to provide a holographic projection of the desired projecting image and so that the holographic projection of the desired projecting image is projected onto the layer to thereby pattern the layer with the desired projecting image.

24. A system according to claim 23 wherein the layer comprises an oxide layer that is activated on exposure to portions of the holographic projection of the desired projecting image having sufficient intensity, so that activated portions of the oxide layer can be selectively removed, maintained, or modified.

25. A system according to claim 23 wherein the layer comprises a silicon layer that is activated on exposure to portions of the holographic projection of the desired projecting image having sufficient intensity, so that activated portions of the silicon layer can be selectively oxidized or modified.

26. A system according to claim 23 wherein the means for projecting the coherent beam of electrons further comprises means for generating the coherent beam of electrons from a nanotip field emitter.

27. A system according to claim 26 wherein the nanotip field emitter comprises a tip having dimensions on the order of an atom.

28. A system according to claim 23 wherein the holographic projection of the desired projecting image comprises a Fresnel hologram.

29. A system according to claim 23 further comprising:
means for filtering the portion of the coherent beam of electrons reflected off the reflector surface to reduce transmission of portions of the interference pattern corresponding to defects on the reflector surface.

30. A system according to claim 23 wherein the means for projecting the coherent beam of electrons comprises means for projecting two coherent beams of electrons toward the reflector surface.

31. A system according to claim 23 further comprising:
means for projecting coherent radiation toward a second reflector surface so that the coherent radiation is reflected off the second reflector surface to provide a second holographic projection of reflected radiation; and
means for maintaining the substrate including the layer in the path of the radiation reflected off the second reflector surface so that the second holographic projection is projected onto the layer.

32. A system according to claim 23 further comprising:
means for projecting a portion of the coherent beam of electrons to the substrate including the layer without reflecting off the reflector surface.

33. A system for patterning a layer on a substrate with a desired projecting image, the system comprising:
a reflector surface that has been patterned to include variation in a property thereof providing information that corresponds to the desired projection image;
means for projecting coherent radiation along divergent paths toward the reflector surface so that the coherent radiation is reflected off the reflector surface;
means for projecting a portion of the coherent radiation to the substrate including the layer without reflecting off the reflector surface; and
means for maintaining the substrate including the layer in the path of the reflected radiation and in the path of the portion of the coherent radiation projected without reflecting off the reflector surface so that the reflected radiation and the coherent radiation projected without reflecting off the reflector surface interfere to provide a holographic projection of the desired projecting image and so that the holographic projection of the desired projecting image is projected onto the layer to thereby pattern the layer with the desired image.

34. A system according to claim 33 wherein the layer comprises an oxide layer that is activated on exposure to portions of the holographic projection of the desired projecting image having sufficient intensity, so that activated portions of the oxide layer can be selectively removed, maintained, or modified.

35. A system according to claim 33 wherein the layer comprises a silicon layer that is activated on exposure to portions of the holographic projection of the desired projecting image having sufficient intensity, so that activated portions of the silicon layer can be selectively oxidized or modified.

36. A system according to claim 33 wherein the means for projecting coherent radiation further comprises means for generating the coherent beam of electrons from a nanotip field emitter.

37. A system according to claim 36 wherein the nanotip field emitter comprises a tip having dimensions on the order of an atom.

38. A system according to claim 33 wherein the means for projecting coherent radiation comprises means for projecting laser radiation.

39. A system according to claim 33 wherein the holographic projection of the desired projecting image comprises a Fresnel hologram.

40. A system according to claim 33 further comprising:
means for filtering the coherent radiation reflected off the reflector surface to reduce transmission of portions of the interference pattern corresponding to defects on the reflector surface.

41. A system according to claim 33 wherein the means for projecting coherent radiation comprises means for projecting two beams of coherent radiation toward the reflector surface.

42. A system according to claim 33 further comprising:
means for projecting coherent radiation toward a second reflector surface so that the coherent radiation is reflected off the second reflector surface to provide a second holographic projection of reflected radiation; and
means for maintaining the substrate including the layer in the path of the radiation reflected off the second reflector surface so that the second holographic projection is projected onto the layer.

43. A system for patterning a layer on a substrate surface with a desired projecting image, the system comprising:
a reflector surface that has been patterned to include variation in a property thereof providing information that corresponds to the desired projection image; and
a radiation source that is configured to project a coherent beam of electrons toward the reflector surface so that a portion of the coherent beam of electrons is reflected off the reflector surface and so that a portion of the coherent beam of electrons is projected to the layer without reflecting off the reflector surface so that the portion of the coherent beam of electrons reflected of the reflector surface and the portion of the coherent beam of electrons projected without reflecting off the reflector surface interfere to project a holographic projection of the desired projection image on the layer so that the holographic projection of the desired projection image is used to pattern the layer with the desired projection image.

44. A system according to claim 43 wherein the layer comprises an oxide layer that is activated on exposure to portions of the holographic projection of the desired projection image having sufficient intensity, so that activated portions of the oxide layer can be removed, maintained, or modified.

45. A system according to claim 43 wherein the layer comprises a silicon layer that is activated on exposure to portions of the holographic projection of the desired projection image having sufficient intensity, so that activated portions of the silicon layer can be selectively oxidized or modified.

46. A system according to claim 43 wherein the radiation source comprises a nanotip field emitter.

47. A system according to claim 46 wherein the nanotip field emitter comprises a tip having dimensions on the order of an atom.

48. A system according to claim 43 wherein the holographic projection of the desired projection image comprises a Fresnel hologram.

49. A system according to claim 43 further comprising:
a filter that is configured to filter the portion of the coherent beam of electrons reflected off the reflector surface to reduce transmission of portions of the interference pattern corresponding to defects on the reflector surface.

50. A system according to claim 43 wherein the radiation source comprises two radiation sources that are each configured to project a respective coherent beam of electrons toward the reflector surface.

51. A system according to claim 43 wherein the radiation source is further configured to project coherent radiation toward a second reflector surface so that the coherent radiation is reflected off the second reflector surface to project a second holographic projection of reflected radiation on the layer.

52. A system according to claim 43 wherein the radiation source projects a portion of the coherent beam of electrons to the layer without reflecting off the reflector surface.

53. A system for patterning a layer on a substrate surface with a desired projection image, the system comprising:
a reflector surface that has been patterned to include variation in a property thereof providing information that corresponds to the desired projection image; and a radiation source that is configured to project coherent radiation along divergent paths toward the reflector surface so that the coherent radiation is reflected off the reflector surface and so that a portion of the coherent radiation is projected to the layer without reflecting off the reflector surface so that the coherent radiation reflected of the reflector surface and the coherent radiation projected without reflecting off the reflector surface interfere to project a holographic projection of the desired projection image on the layer so that the holographic projection of the desired projection image is used to pattern the layer with the desired projection image.

54. A system according to claim 53 wherein the layer comprises an oxide layer that is activated on exposure to portions of the holographic projection of the desired projection image having sufficient intensity, so that activated portions of the oxide layer can be removed, maintained, or modified.

55. A system according to claim 53 wherein the layer comprises a silicon layer that is activated on exposure to portions of the holographic projection of the desired projection image having sufficient intensity, so that activated portions of the silicon layer can be selectively oxidized or modified.

56. A system according to claim 53 wherein the coherent radiation comprises a coherent beam of electrons.

57. A system according to claim 53 wherein the radiation source comprises a nanotip field emitter.

58. A system according to claim 57 wherein the nanotip field emitter comprises a tip having dimensions on the order of an atom.

59. A system according to claim 53 wherein the coherent radiation comprises laser radiation.

60. A system according to claim 53 wherein the holographic projection of the desired projection image comprises a Fresnel hologram.

61. A system according to claim 53 further comprising:
a filter that is configured to filter the coherent radiation reflected off the reflector surface to reduce transmission of portions of the interference pattern corresponding to defects on the reflector surface.

62. A system according to claim 53 wherein the radiation source comprises two radiation sources that are each configured to project a respective beam of coherent radiation toward the reflector surface.

63. A system according to claim 53 wherein the radiation source is further configured to project coherent radiation toward a second reflector surface so that the coherent radiation is reflected off the second reflector surface to project a second holographic projection of reflected radiation on the layer.

* * * * *